United States Patent
Yakshin et al.

(12) 
(10) Patent No.: US 6,483,597 B2
(45) Date of Patent: Nov. 19, 2002

(54) METHOD FOR THE PRODUCTION OF MULTI-LAYER SYSTEMS

(75) Inventors: Andrey E. Yakshin, Nieuwegein (NL); Eric Louis, Ijsselstein (NL); Frederik Bijkerk, Amsterdam (NL)

(73) Assignee: Carl-Zeiss-Stiftung, Heidenheim (DE)

(*) Notice: Subject to any disclaimer, the term of this patent is extended or adjusted under 35 U.S.C. 154(b) by 43 days.

(21) Appl. No.: 09/836,654

(22) Filed: Apr. 17, 2001

(65) Prior Publication Data

US 2001/0038456 A1 Nov. 8, 2001

(30) Foreign Application Priority Data

Apr. 18, 2000 (DE) .......................................... 100 19 045

(51) Int. Cl.$^7$ ........................... G01B 11/28; G01B 11/06

(52) U.S. Cl. ........................ 356/630; 356/503; 356/632

(58) Field of Search .............................. 356/485, 503, 356/630, 632

(56) References Cited

U.S. PATENT DOCUMENTS

| | | | | |
|---|---|---|---|---|
| 4,909,631 A | * | 3/1990 | Tan ............................. | 356/632 |
| 5,151,295 A | | 9/1992 | Kawahara et al. ............ | 427/12 |

FOREIGN PATENT DOCUMENTS

| | | |
|---|---|---|
| DE | 2750421 | 5/1979 |
| JP | 61296305 A | 12/1986 |
| JP | 63028862 A | 2/1988 |

OTHER PUBLICATIONS

*Experience with the in situ monitor system for the fabrication of x-ray mirrors*, Eberhard Spiller, Applications of Thin–Film Multilayered Structures to Figured X–Ray Optics, SPIE vol. 563, (1985); pp. 367–375.

(List continued on next page.)

*Primary Examiner*—Huy Mai
(74) *Attorney, Agent, or Firm*—Hudak, Shunk & Farine Co. LPA (57) ABSTRACT

A method for the production of multi-layer systems with N layers having predetermined thickness, especially for the production of multi-layer systems for wavelength ranges in the extreme ultraviolet and soft X-ray wavelength range is described, in which N layers are deposited and if need be one or more layers are partially removed after deposited and in wich at the same time as deposition and/or removal of layers, the layers' reflectivity dependent on layer thickness is measured. The method includes the following steps:

Calculation of a reflectivity-time curve of the multi-layer system to be produced Determination of points in time $t_i$ (i=1, 2, ..., N), at which the deposition of the i-th layer is to be stopped; and if need be determination of points in time $t_i'$ (i=1, 2, ..., N), at which the partial removal of the i-th layer is to be stopped, and at which the reflectivity at $t_i$ or $t_i'$ is in the range of a turning point of the reflectivity-time curve;

Calculation of parameters $k_i$ (i=1,2, ..., N) for deposition and if need be $k_i'$ (i=1,2, ..., N) for partial removal, Deposition of the first layer with simultaneous reflectivity measurement; and calculation of the current parameter $k_{c/i}$ based on intensities of the reflectivity measurement;

Stopping of the deposition as soon as $k_{c/i}=k_i$;

and if need be partial removal of the first layer with simultaneous reflectivity measurement and calculation of the current parameter $k_{c/i}$ based on intensities of the reflectivity measurement;

Stopping of the partial removal as soon as $k_{c/i}=k_i$;

Repetition of the previous steps for all subsequent layers up to and including layer N.

15 Claims, 3 Drawing Sheets

U.S. PATENT DOCUMENTS

| | | | | |
|---|---|---|---|---|
| 5,307,395 A | * | 4/1994 | Seely et al. | 378/84 |
| 5,310,603 A | * | 5/1994 | Fukuda et al. | 428/446 |
| 5,551,587 A | | 9/1996 | Keppel et al. | 216/24 |
| 6,215,556 B1 | * | 4/2001 | Zhang et al. | 356/503 |

OTHER PUBLICATIONS

*Deposition and Characterization of Multilayer X–Ray Reflection Coatings*, Marcel Peter Bruijn, Dissertation, University of Amsterdam, (1986), pp. 15–30.

*Formation and Characterization of Multilayer Coatings for X–Ray Optics*, J. Verhoeven, E. Puik, M. J. van der Wiel, Vacuum, vol. 39, No. 7/8, (1989), pp. 711–716.

*Controlled Fabrication of Multilayer Soft X–Ray Mirrors*, Eberhard Spiller et al., Appl. Phys. Lett., vol. 37, No. 11, Dec. 1, 1980, American Institute of Physics (1981); pp. 1048–1050.

* cited by examiner

METHOD FOR THE PRODUCTION OF MULTI-LAYER SYSTEMS

CROSS REFERENCE

This application claims the foreign priority benefit of German Application No. 100 19045.6-51, filed Apr. 18, 2000 for Method For The Production Of Multi-Layer Systems.

FIELD OF THE INVENTION

The invention relates to a method for the production of multi-layer systems with N layers having predetermined thicknesses, especially for the production of multi-layer systems for wavelength ranges in the extreme ultraviolet and soft X-ray wavelength range, in which N layers are deposited and if need be one or more layer are partially removed after deposition and in which at the same time as deposition and/or removal of layers, the layers' reflectivity dependent on layer thickness is measured.

BACKGROUND OF THE INVENTION

Artificially adjusted multi-layer systems which are used as interference systems have been known for decades. In the visible wavelength range, they play an important role in optical products such as cold light mirrors, filters etc. It is a question, within a given wavelength range, of achieving as complete a reflection, or possibly in some circumstances also transmission, as possible, on the multi-layer system, however achieving a negligible transmission/reflection in the wavelength ranges outside, as transition-free as possible. In order, for example, to produce multi-layer X-ray mirrors with high reflectivity, a large number of thin layers must be applied, in such a way that all the layers with an essentially equal phase contribute towards the reflected beam.

As a rule the layering consists of a number of alternating layers of two or more materials, which have different refractive indices. For specific wavelengths an additional reflection due to interference occurs on all pairs of layers with periodic structure, which in a first approximation is described by the Bragg equation: $2 \cdot d \sin \theta_m = m \cdot \lambda$, where $d = d_A + d_B$ is the sum of the individual layer thicknesses of the materials A and B, $\lambda$ the wavelength, $\theta_m$ the angle of incidence and m the order of diffraction.

The maximum reflectivity can be optimised by two opposite possibilities. One possibility consists of using materials whose refractive indices differ from each other as much as possible. The layers all have the same optical thickness. In the case of an angle of incidence of 90° the layer thickness corresponds to a quarter of the wavelength which is reflected in phase. The other possibility consists of reproducing an "ideal Bragg crystal", in which layers of absorbent material, which are as thin as possible, preferably atomic monolayers, alternate with thick layers of non-absorbent material. Losses due to absorption are minimised, by disposing the thin absorbent layers in the nodal planes of the standing waves, which are produced by the incident and reflected beam. X-ray mirrors are used for example in X-ray fluorescence analysis and X-ray astronomy. A commercially highly significant deposition of interference mirrors in the X-ray and ultraviolet range is semi-conductor lithography. For this deposition optical elements made from multi-component multi-layer systems are used primarily to reproduce semi-conductor circuit structures on wafers.

Deviations from the theoretical reflectivity of an interference system result primarily from flaws in the thickness of the individual layers. This problem becomes even more serious if the number of layers is very high. Also the roughness of the interfaces between the individual layers reduces reflectivity as the intensity is reduced by scatter on the surface roughnesses.

The patent specification DE 27 50 421 C2 describes a measuring method and measuring device for the production of multi-layer systems for the visible wavelength range. In this, alternating layers with high and low refractivity are applied to transparent substrates. At the same time the layers are each applied to one test glass per material, the test glasses being exposed to the same coating material flow as the substrates.

During coating, the transmission and/or reflection behaviour of the layers is continuously registered. For this purpose the test glass just being coated is impinged upon by a monochromatic light beam and the proportion of light reflected or passing through is measured. To obtain the layer thickness from the reflectivity, advantage is taken of the fact that the light beam which is reflected on the upper surface of the layer and the light beam which is reflected on the undersurface of the layer, i.e. in the case of test glasses the interface between layer material and glass, are superimposed. Depending on the relative retardation or phase difference of these two beams, negative or positive interference phenomena will be obtained.

Ideally, the reflectivity depends sinusoidally on the layer thickness. The reflectivity measurement result will thus be used for definite interruption of the coating process. The multi-layer systems produced have constant layer thicknesses of $\lambda/4$. $\lambda$ is the wavelength which will be the wavelength in the case of later use, as well as the wavelength with which the reflectivity is measured. The coating process is always interrupted either at maximum or minimum reflectivity. The extrema can be registered manually or automatically for the visible wavelength range sufficiently accurately without great expense.

The "minimum-maximum method" is also applied in the U.S. Pat. No. 5,551,587, the U.S. Pat. No. 5,151,295 and the JP 61296305 A. As a rule, the thickness of the deposited layer is parametrised by the deposition time. According to the JP 61296305 A, two beams of different wavelengths are used to measure the transmission dependent on the time during the deposition of the layers. This improves the accuracy of the determination of the peak values of the transmission. The actual deposition stop occurs slightly after the respective peak values.

The special feature of the U.S. Pat. No. 5,551,587 is to manufacture a multilayer mirror by stimulation of the penetration of one of the materials into the layer with the other material after which the original layer thickness of the first material is removed by etching.

The JP 63028862 A improves the accuracy of the "minimum-maximum method" by fitting the measured transmittivity or reflectivity data by quadratic regression. The target vapor deposition time of the layer is based on the value obtained.

At the beginning of the 1980s the principle of layer thickness control by means of reflectivity measurements was also successfully transferred to the production of interference systems for the extreme ultraviolet and the soft X-ray range. In this connection see also the publications of E. Spiller et al., Appl. Phys. Lett. 37 (11), pp 1048–1050 (1980), E. Spiller, Proc. SPIE 563, 367 (1985), M. P. Bruijn, Dissertation, University of Amsterdam (1986) and J. Verhoeven et al., Vacuum 39, pp 711–716 (1989).

The terms "extreme ultraviolet" and "soft X-ray range" should here be understood to mean the wavelengths of an order of magnitude between one-tenth and ten nm. Also in the case of production of interference systems for this short-wave wavelength range, the reflectivity is measured in situ, essentially using light of a wavelength that is comparable with that of the final deposition (i.e. soft X-ray range or extreme ultraviolet range), the thickness of the top layer is deduced from the reflectivity and one changes over between the coating with one or other material at the extrema.

In the aforementioned 1985 publication of E. Spiller, the layer thickness is monitored not only via the reflectivity, but also via a quartz crystal monitor. It is a matter of special interference systems in which the absorbing layer is too thin for its thickness to be determined by means of reflectivity measurements. Only the deposition of the less absorbent layer is controlled by means of the reflectivity measurement.

To change over from deposition of the less absorbent layer to deposition of the strongly absorbent layer, a maximum point in the development of the reflectivity is selected. By using the quartz crystal to determine the thickness of the strongly absorbent layer, the inaccuracy in the layer thickness increases considerably.

In contrast to the visible wavelength range, in the extreme ultraviolet and soft X-ray range, absorbing and less absorbing materials are used, to reproduce a virtually "ideal Bragg crystal". This means working with varying layer thicknesses. When changing over at the extreme points of the development in time of reflectivity between coating with different materials, the choice of the parameters layer thickness, wavelength of the reflectivity measuring beam and angle of the reflectivity measuring beam is restricted. In addition, because of the small dimensions of the layer thicknesses, much higher requirements are laid down for precise determination of the extreme points than in the case of interference systems for the visible wavelength range.

The best reflectivities which can be produced with interference systems for the extreme ultraviolet and soft X-ray wavelength range according to the conventional methods, are approx. 69%. Precisely for use of interference systems in semi-conductor lithography, efforts are being made to optimise the reflectivity still further. The theoretical maximum reflectivity lies within the range 73% to 74% depending on material and wavelength. For industrial depositions on a large scale, such as semi-conductor lithography it is also of great significance that the coating process can be fully automated.

The problem of the present invention is to find a method for controlling the layer thickness when applying and, if necessary, removing thin layers, especially in the production of interference systems for reflection of wavelengths in the extreme ultraviolet and soft X-ray wavelength range, with the help of which interference systems can be produced, which on the whole have higher reflectivities and improved wavelength selectivity.

SUMMARY OF THE INVENTION

This problem is solved by a method according to the claims with the following steps:

Calculation of a reflectivity-time curve of the multi-layer system to be produced considering the deposition rate and/or the removal rate, the layer materials, the predetermined layer thicknesses and the wavelength and angle of incidence of the beam used to measure the reflectivity;

Determination of points in time $t_i$ (i=1, 2, ..., N), at which the deposition of the i-th layer is to be stopped; and if need be determination of points in time $t_i'$ (i=1, 2, ..., N), at which the partial removal of the i-th layer is to be stopped, and at which the reflectivity at $t_i$ or $t_i'$ is in the range of a turning point of the reflectivity-time curve;

Calculation of parameters $k_i$ (i=1,2, ..., N) for deposition and if need be $k_i'$ (i=1,2, ..., N) for partial removal, at which $k_i$ and $k_i'$ are defined as ratios of intensity values at predetermined values of the reflectivity curve;

Deposition of the first layer with simultaneous reflectivity measurement; and calculation of the current parameter $k_{c/i}$ based on intensities of the reflectivity measurement;

Stopping of the deposition as soon as $k_{c/i}=k_i$;

and if need be partial removal of the first layer with simultaneous reflectivity measurement and calculation of the current parameter $k_{c/i}$ based on intensities of the reflectivity measurement;

Stopping of the partial removal as soon as $k_{c/i}=k_i$,

Repetition of the previous steps for all subsequent layers up to and including layer N.

In the new method, called "off-extrema method", switching is done when the reflected amplitude from the top layer is partly out of phase with the reflected amplitude from the stack underneath. The phase shift is correlated to a certain intensity variation of the monitor signal and corresponds to the design parameters of the particular multerlayer structure. To create a certain phase shift, the wavelength of X-ray source or angle of monitoring are adjusted. Unlike the classical method, the new method allows switching at arbitrary moments in the monitoring and control process, moments being fully determined by the multilayer design parameters.

The method can be applied, but is not limited, to coating processes based on electron-beam evaporation or ion-beam evaporation/sputtering.

As in the conventional methods, in the method according to the invention also, during deposition and/or, if necessary, removal of thin layers on a substrate or also, in addition, a test substrate, the reflectivity of the layer system is measured. The use of a test substrate for measuring reflection offers itself if the individual components of the coating plant are disposed in such a way that light source, substrate and detector cannot be ideally oriented relative to each other. In the case of use of a test substrate it must however be guaranteed that the test substrate is exposed to the same material flow as the actual substrate. With the method according to the invention a single test substrate is sufficient, to which all the layers are applied. The reflectivity measurement is always carried out with a monochromatic beam.

For preparation of the deposition of the N layers, depending on the parameters of layer material, desired layer thickness for each layer i, wavelength and angle of incidence of the reflectivity measurement beam, a reflectivity curve dependent on the thickness is calculated. The layer thickness for its part depends on the coating time. The exact connection between layer thickness and coating time is determined by the coating process. In a first approximation a linear connection can be assumed. Where time and/or points in time are referred below, this should be understood to mean a parametrisation of the layer thickness. Other parametrisations are also possible.

It is also possible to carry out no parametrisation and to refer directly to specific layer thicknesses (e.g. $d_1$, $D_1$). Parametrisation over time is not restrictive, but is to be understood as one of many possibilities. The theory of calculation of the reflectivity curve is to be found, for example, in M. P. Bruijn, Dissertation, University of Amsterdam, 1985. To obtain the greatest possible correspondence between the theoretical calculation and the measured reflectivity curve, amongst other things the contributions of the lower layers and the influence of the surface roughness and/or interface roughness should also be taken into consideration.

The point in time $t_i$ is selected for each layer i, in such a way that the phase difference of the beams reflecting at the surface and the undersurface amounts to zero or an integral multiple of $\pi/2$. The point in time $t_i$ should then essentially lie within the range of a tuning point of the reflectivity curve, i.e. in the steepest range, in which the sensitivity to the direct determination of the point in time $t_i$ is greatest during the measuring process. This reduces the errors in the layer thickness of the individual layers i.

The steps of deposition, determination whether $t_i$ is reached and stopping the deposition are repeated for all subsequent layers, up to and including the final layer N.

The points in time at which the extrema are present shall advantageously be designated $T_1$. The change-over point in time $t_1$ should always be defined in relation to the previous extremum in time $T_1$. The advantage lies in the fact that during measurement of the reflectivity and the layer thickness, the extremum can be determined as accurately as possible, as a data range can be used for the evaluation, in which the extremum does not lie at the range limit. It is then possible to determine $t_i$ with corresponding accuracy.

The selection of the means for calculating the point in time $t_i$ should take into consideration the fact that the time interval up to determination of the point in time $T_i$ must be smaller than the time interval between $T_i$ and $t_i$. Except with very high coating rates and very thin layers this should not represent any problem.

With the conventional methods only those data can be evaluated, which lie before the extremum. As, however, around the extremum, the derivation of the reflectivity curve according to thickness tends towards zero, i.e. great changes in thickness result in only slight changes in the reflectivity, the extreme point in the conventional method can only be poorly determined. This is made even more difficult by the fact that determination of the extremum can be further distorted by background noise or statistic fluctuations in the signal.

In the method according to the invention, by evaluation of the data on both sides of the extremum, the position of the extremum can be determined more accurately, and the position of the point in rime t; can also be determined more accurately with simultaneous reflectivity measurement, as it lies in the steeper range of the reflectivity curve. The greater accuracy of the layer thicknesses in the method according co the invention makes it possible to produce interference systems which have improved reflectivity.

After all the coating parameters are established, deposition of the first layer is commenced. At the same time the reflectivity of this layer or the equivalent layer on a test substrate is measured. During the measurement the point in time $T_i$, i.e. the position of the extreme point of the reflectivity curve for this layer i is determined from the measured data. After the point in time $T_i$ is passed, as soon as the point in time $t_i$ is reached, deposition of the layer is stopped.

Actually the method is indepent of time, i.e. of points in time $t_i$ and $t_i'$, because the points in time are used of define the parameter $k_i$ and $k_i'$. The deposition and partial removal are stopped when the current parameters $k_{c/i}$ and $k_{c/i}'$ reach the parameters $K_i$ and $k_i'$ respectively. If the deposition rate or the removal rate are not constant during deposition or removal the predetermined deposition or removal time would not be met. As the deposition or removal is correlated to the time-independent parameters $k_{c/i}$ and $k_{c/i}'$ the precision can be observed in any case.

Preferably the definition of parameters $k_i$ and $k_i'$ is based on an apse and on the starting and terminal value in the neighbourhood of the apse and/or on a second apse in the interval $t_i - t_{i-1}$.

Preferably the parameters $k_i$ and $k_i'$ for two materials of a multi-layer system are defined as follows:

for the first material $k_i = |(I_{C-IB})/(I_B - I_A)|$ with $I_B$=apse, $I_A$=starting value and $I_C$=terminal value in the interval $t_i - t_{i-1}$ for the second material $k_i = |(I_F - I_E)/(I_D - I_E)|$ with $I_E$=apse, $I_F$=terminal value and $I_D$=second apse in the internal $t_i - t_{i-1}$, for the partial removal of the second material $k_i' = |(I_F - I_G)/(I_F - I_E)|$ with $I_E$=apse, $I_F$=terminal value in the interval $t_i - t_{i-1}$, and $I_G$=terminal value in the current stage.

Another possibility to define the parameters is as follows $k_i = I_C/I_B$ (for the first material) and $k_i = I_F/I_E$, $k_i' = I_G$ (for the second material).

$k_i$, $k_i'$ values can differ from one period to another depending on the particular multilayer design.

In general, the real monitoring curve can deviate somewhat from the simulated one. Consequently, different procedures of the switching point determination in the monitoring process can lead to slightly different precision of the control.

These process steps can be transferred to a control device. For this purpose coating parameters are stored in the control device. During the deposition the control device determines $T_1$ from the reflectivity data, and compares the coating parameters with tile measured values, to ascertain whether the point in time $t_i$ or $k_i$ is already reached and deposition must be stopped. In this way the method according to the invention can be fully automated, which makes it of interest for large-scale industrial use in semi-conductor lithography.

The reflectivity is also enhanced in that the surface of a layer i may be polished before the layer i+1 is applied. Also the points in time $t_1'$ or $k_i'$, at which the deposition is stopped, should be established in advance on the basis of the calculated reflectivity curve. In this connection it is to be noted that the removal resulting from polishing is taken into consideration in the layer thickness to be applied. This means that slightly more should be applied than the desired layer thickness.

If polishing, involving some removal, of layer i is planned, this is now carried out from the point in time $t_i$ up to the point in time $t_i'$ or $k_i'$. This can also be carried out by the control device.

In addition, for rough monitoring of the layer thicknesses, a quartz crystal monitor or a mass spectrometer can be used.

In particular in order to produce interference systems for the range of the extreme ultraviolet and soft X-ray range with the method according to the invention, the layer thicknesses should be selected between 0.1 nm and 50 nm. Especially preferable are layer thicknesses between 1 nm and 30 nm.

The best results are achieved if the wavelength of the beam of the reflectivity measurement lies between 2 nm and 200 nm. The angle of incidence is selected corresponding to the wavelength and the thickness of the layers.

A major advantage over the conventional methods is that the selection of the wavelength, and of the angle of incidence of the monochromatic light beam for reflectivity measurement, is no longer limited by the measuring method itself, but now only by the experimental set-up. This makes it possible to produce interference systems with layer thickness conditions, which were not accessible with the conventional methods. In particular the production of interference systems with non-constant layer thickness conditions or of non-plane or aspherical interference systems is greatly facilitated. By variation of the layer thickness conditions throughout the total thickness of the interference system the reflectivity can be still further enhanced.

The number of layers N should, advantageously lie between 2 and 1000. Especially preferred are interference systems with 80 to 1000 layers. In particular the number of layers should be especially high in the case of extremely short wavelengths.

Different methods can be used for deposition of the individual layers. Methods can be used which are based on thermal evaporation of the material or the sputtering method. The advantages of the sputtering method are that the sputtering process itself can be well controlled by means of well-defined ion energies and angles of incidence. In the case of the method based on thermal evaporation, above all electron beam evaporation and laser evaporation are of great importance for the production of interference systems for the extreme ultraviolet and soft X-ray range. Electron beam evaporation is preferably used. The advantages of electron beam evaporation are that most process parameters (energy, angle etc.) are independent of one another and can therefore be optimised individually. In the last two processes mentioned, layers with little roughness are produced by depositing by evaporation. However not all materials can be evaporated by electron beams or laser pulses. The quality of the films which are deposited by laser evaporation, with regard to the thickness and surface roughness, is better than in the case of electron beam evaporation, however the rate of depositing by evaporation is very much lower. Moreover, depositing by evaporation can only be carried out within a limited solid angle, so that it is not possible to coat larger areas.

As degradation of the reflectivity signal by noise cannot be fully suppressed, it has proved advantageous to determine the points in time $T_1$, $t_i$ or $t_i'$ by fitting the measured reflectivities dependent on time. For this, the method of least squares has proved particularly successful. For fitting the data, the measured reflectivities are taken into consideration, which lie within a time interval lying approximately symmetrically around the extreme point. By fitting the data a point in time, $T_i$, $t_i$ and $t_i'$ is obtained from which the error resulting from the background noise has essentially been calculated out.

For the removal of the layer i, the use of ion beams has proved successful. By using ion beams, material is removed and the surface polished simultaneously. In addition there is a kind of recrystallisation effect, which leads to the layer becoming denser at its surface, and hence more resistant to, for example, radiation damage.

Preferably alternating layers of a strongly absorbent material and of a less absorbent material are applied. By skilful choice of the layer thicknesses, an ideal "Bragg crystal" is reproduced. As a rule transition metals and refractory metals or their compounds are chosen for the strongly absorbent material. Especially preferred in combination with the method according to the invention are: molybdenum, molybdenum carbide, molybdenum silicide, rhenium-tungsten, tungsten, tungsten cabride, tungsten silicide, nickel or nickel silicide. The less absorbent materials chosen are predominantly light non-metals. Silicon, carbon, boron or even beryllium are preferred.

The ratio of the layer thickness of the strongly absorbent material to the total of the layer thickness of the less absorbent material and layer thickness of the strongly absorbent material, the "gamma ratio" is preferably selected between 0.2 and 0.8. A gamma ratio between 0.35 and 0.45 is especially preferred.

An advantage of the method according to the invention is that the gamma ratio can be adjusted as desired. In particular the gamma ratio can be varied during the coating process, to produce especially optimised interference systems with especially high reflectivity. Above all, with the method according to the invention, the production of interference systems with varying gamma ratios can be automated, without this requiring greater expense than in the case of conventional interference systems. This was not possible with the conventional methods.

To achieve the greatest possible reflectivity, it has proved advantageous, after each deposition of a pair of layers of strongly and less absorbent material, i.e. a period, to polish the topmost layer with an ion beam before the further deposition of the next layer. This means that any surface roughnesses are not continued and accumulated throughout the whole layer system thus reducing the reflectivity.

BRIEF DESCRIPTION OF THE SEVERAL VIEWS OF THE DRAWINGS

The present invention will be explained in more detail with reference to the following figures. These show.

DETAILED DESCRIPTION OF THE INVENTION

Figure 1:
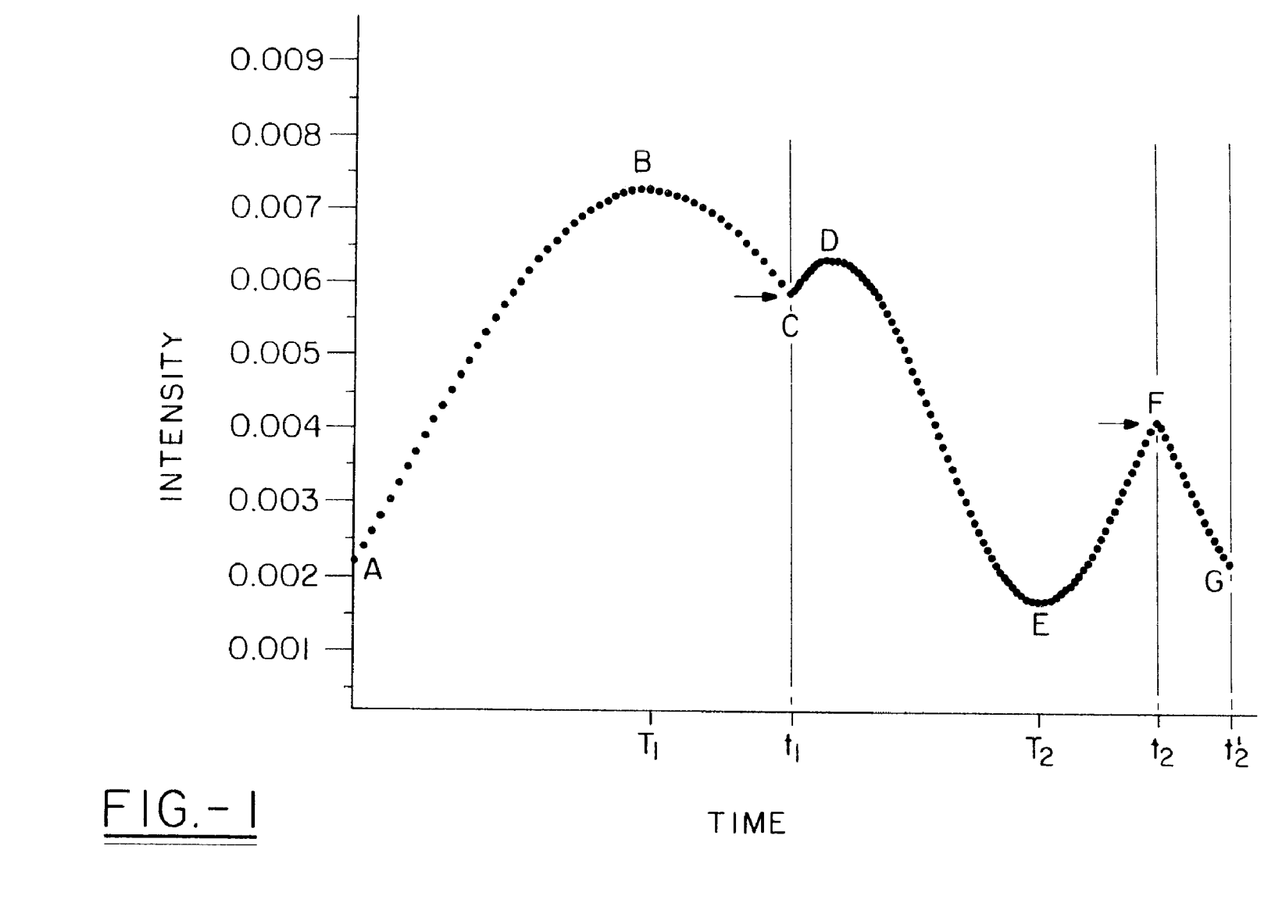
FIG. 1 a calculated intensity curve with points in time $t_i$, $T_i$, and $t_i'$, FIG. 2a the measured intensity curve of an interference system and FIG. 2b the measured intensity curve of a further interference system.

FIG. 1 shows the calculation reflectivity curve dependent on time or thickness for an interference system made from molybdenum and silicon. It was calculated for an angle of incidence of 16.88° and a wavelength λ=3.16 nm of the beam for the reflectivity measurement. The curve shows the calculated intensity in arbitrary units depending on the time and/or thickness. For this purpose thickness was assumed as a linear function of time.

At point A depositing by evaporation using electron beam evaporation of the molybdenum is started. As the thickness increases, the reflectivity rises to the maximum B. At this point the reflected beams from the surface of the molybdenum layer and the interface between the molybdenum layer and the layer beneath it lie in phase. As the thickness increases further, the two reflected beams are no longer in phase and no longer add up completely. For this reason the intensity again drops as far as point C, which lies in the range of a turning point of the reflectivity curve that can be assumed, if the deposition would not be discontinued, and which has been established as stopping time $t_1$ for deposition of the molybdenum layer i=1.

The position of the maximum B is designated by the point in time $T_1$, $t_1$ is defined in relation to $T_1$ via the ratio $|(I_C-I_B)/(I_B-I_A)|=k_1$. The coating parameter $k_1$ could also be defined differently, e.g. via $I_C/I_B=k_1$. Once the time $T_1$ and/or the maximum B is passed, the coating is continued until the ratio $k_{c/1}=|(I_{current}-I_B)/(I_B-I_A)|\geq k_1$.

As soon as the threshold $k_1$ is passed, the process changes over to depositing by evaporation of silicon. Initially the reflectivity rises somewhat to the maximum D, which, however, is not relevant for the control of this coating process. Subsequently the reflectivity declines as far as the minimum E, at which the beam reflected at the surface of the silicon layer and the beam reflected at the interface with the molybdenum are inversely phased and completely cancel each other out. The position of the minimum E is designated by the time $T_2$.

The point in time $t_2$, at which the depositing by evaporation of the silicon is switched off is defined with reference to the time $T_2$ via the ratio $|(I_F-I_E)/(I_D-I_E)|=k_2$. After passing through the minimum E, the depositing-by-evaporation process is switched off as soon as the ratio $k_{c/2}=|(I_{current}-I_E)|\geq k_2$. A ratio could also be formed with $I_C$ instead of $I_D$.

At point F removal of the silicon layer for polishing purposes is started. F lies approximately at a turning point of the reflectivity curve that can be assumed, if the deposition would not be discontinued. The end point for the polishing is related directly to point F. $k'_2$ is defined as $|(I_G-I_F)/(I_F-I_E)|$. The polishing is thus stopped as soon as the ratio $k_{c/2}=|I_{current}-I_F)/(I_F-I_E)|\geq k_2'$ is equal to a constant $k_3$. Reference back to point E is not absolutely necessary. Following the polishing, deposition of the next molybdenum layer can be started again.

Figure 2A:
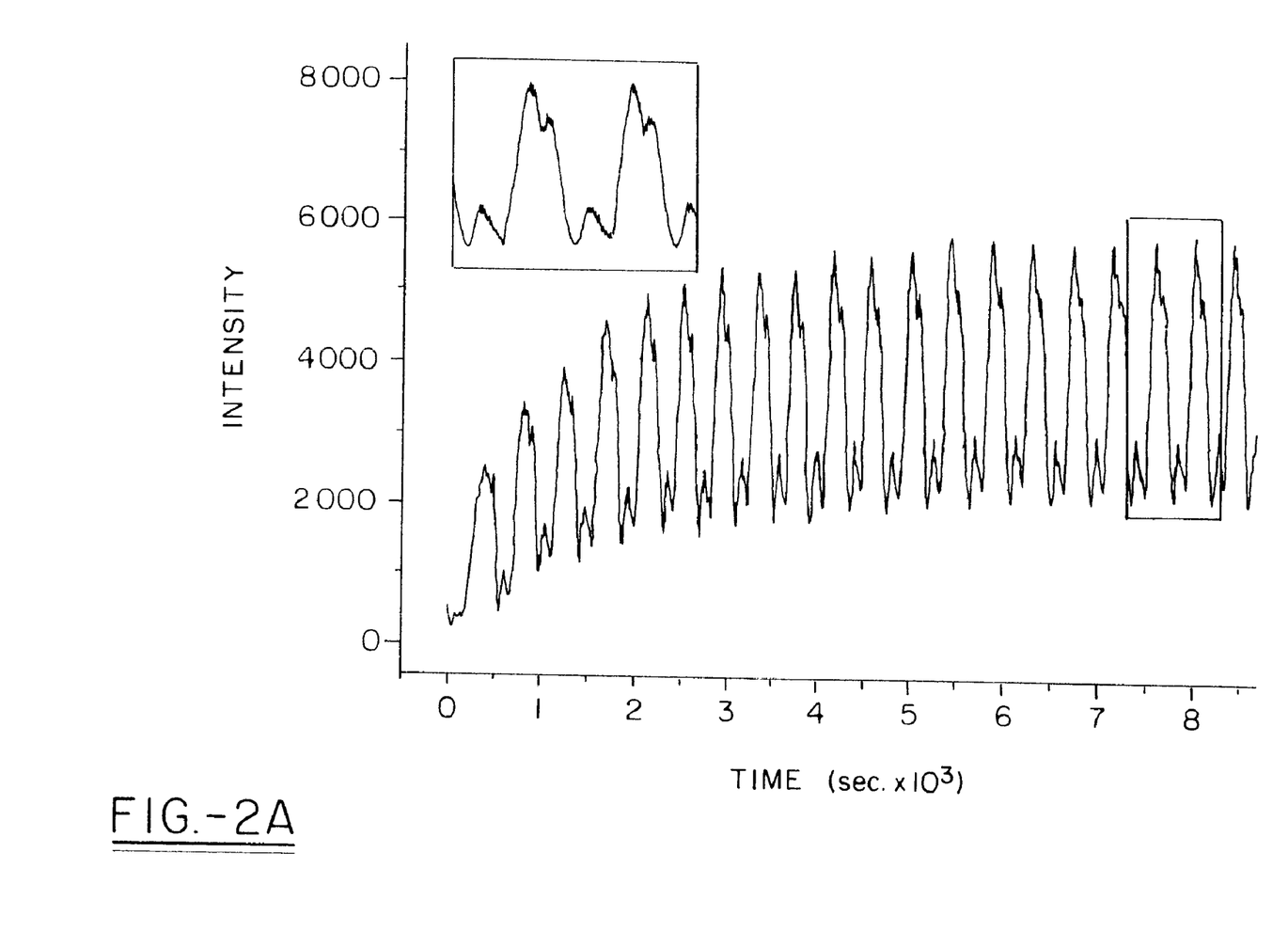
Figure 2B:
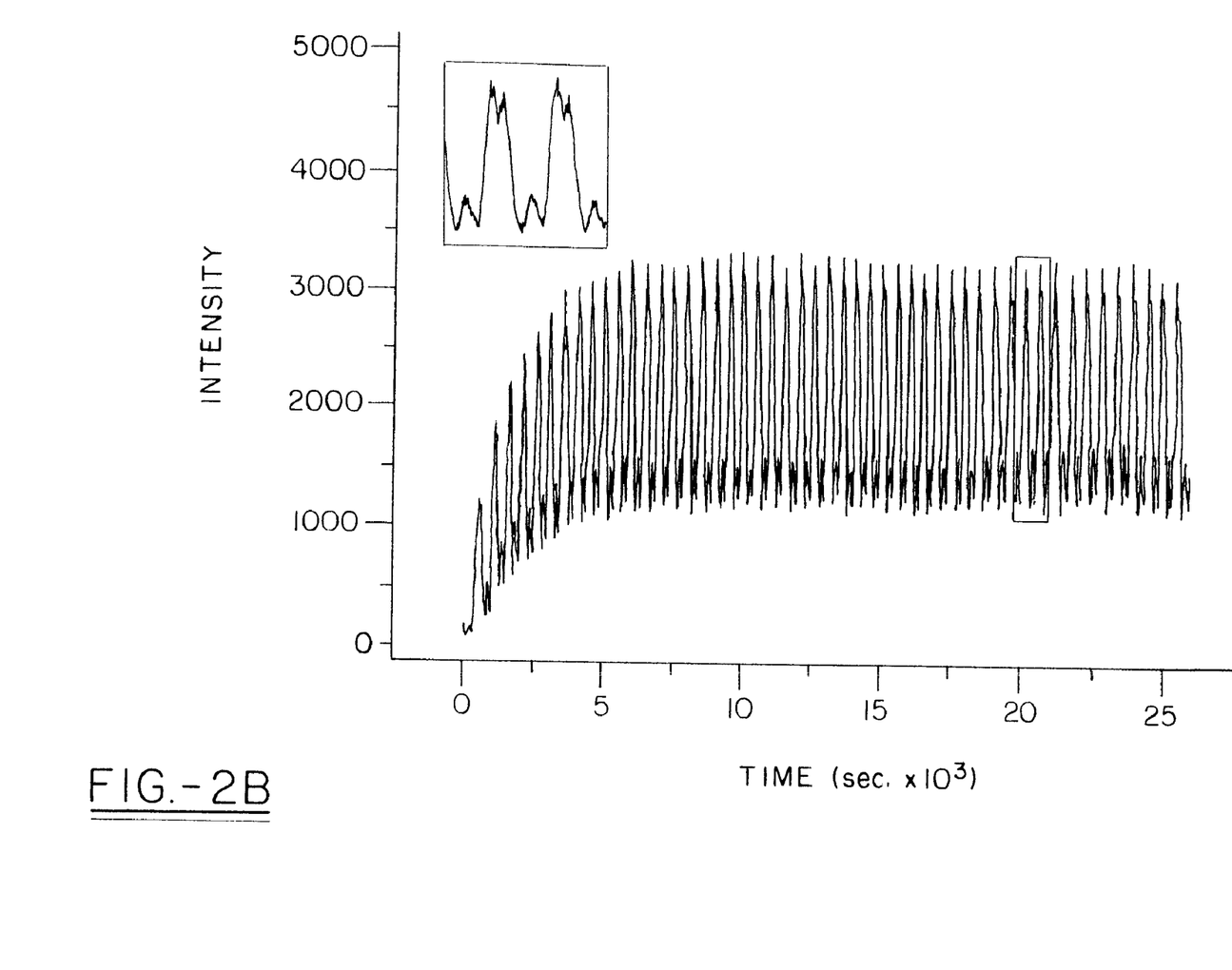

FIGS. 2a and 2b show actually measured reflectivity curves during production of an X-ray interference mirror. In FIG. 2a, alternating multi-layer layers of molybdenum and silicon were applied for 2½ hours, in FIG. 2b an interference system was also produced from molybdenum and silicon in 7 hours. The reflectivity was measured at 3.16 nm in both cases. In FIG. 2a the angle of incidence amounted to 16.88°, in FIG. 2b it amounted to 16.06°. In both cases the constants $k_1$, $k_2$, $k_2'$ for the first ten periods are different to the constants for the following periods.

For the interference system in FIG. 2a the parameters were consequently chosen as follows $k_1=0.23$, $k_2=0.25$, and $k_1'=0.70$. The resulting phase thickness amounts to 6.40 nm, the gamma ratio amounts to 0.363. In total 20 periods, i.e. 40 layers were applied.

In FIG. 2b the parameters were chosen as follows: $k_1=0.10$, $k_2=0.23$, and $k_2'=0.70$. This results in a phase thickness of 6.72 nm and a gamma ratio of 0.358. In total 50 phases, i.e. 100 layers were applied.

In both FIG. 2a and FIG. 2b, the constancy of the amplitudes over a long period is remarkable. This proves that the deviations in thickness are very small and the periodicity of the multi-layer system is high.

With the mirror in FIG. 2a, a reflectivity of 69.2% was achieved at 12.8 nm and 90°. With the mirror in FIG. 2b a reflectivity of 69.4% was also achieved at 12.8 nm and 90°.

What is claimed is:

1. A method for the production of multi-layer systems with N layers having predetermined thickness, especially for the production of multi-layer systems for wavelength ranges in the extreme ultraviolet and soft X-ray wavelength range, in which N layers are deposited and if need be one or more layers are partially removed after deposition and in which at the same time as deposition and/or removal of layer, their reflectivity dependent on layer thickness is measured, with the following steps:

calculation of a reflectivity-time curve of the multi-layer system to be produced considering the deposition rate and/or the removal rate, the layer materials, the predetermined layer thicknesses and the wavelength and angle of incidence of the beam used to measure the reflectivity;

determination of points in time $t_i$ (i=1, 2, ..., N), at which the deposition of the i-th layer is to be stopped; and if need be determination of points in time $t_i'$ (i=1,2 ..., N), at which the partial removal of the i-th layer is to be stopped, and at which the reflectivity at $t_i$ or $t_i'$ is in the range of a turning point of the reflectivity-time curve;

calculation of parameters $k_i$ (i=1,2, ..., N) for deposition and if need be $k_i'$ (i=1, 2, ..., N) for partial removal, at which $k_i$ and $k_i'$ are defined as ratios of intensity values at predetermined values of the reflectivity curve;

deposition of the first layer with simultaneous reflectivity measurement; and calculation of the current parameter $k_{c/i}$ based on intensities of the reflectivity measurement;

stopping of the deposition as soon as $k_{c/i}=k_i$;

and if need be partial removal of the first layer with simultaneous reflectivity measurement and calculation of the current parameter $K_{c'/i}$ based on intensities of the reflectivity measurement;

stopping of the partial removal as soon as $k_{c'i}=k_i'$;

repetition of the previous steps for all subsequent layers up to and including layer N.

2. A method according to claim 1, wherein the definition of parameters $K_i$ and $K_i'$ is based on an apse and on the starting and terminal value in the neighborhood of the apse and/or on a second apse in the interval $t_i-t_{1-1}$.

3. A method according to claim 1, wherein the parameters $k_i$ and $k_i'$ for two materials of a multi-layer system are defined as follows:

for the first material $k_i=|(I_C-I_B)/(I_B-I_A)|$ with $I_B$=apse, $I_A$=starting value and $I_C$=terminal value in the interval $t_i-t_{i-1}$ for the second material $k_i=|(I_F-I_E)/(I_D-I_E)|$ with $I_E$=apse, $I_F$=terminal value and $I_D$=second apse in the internal $t_i-t_{i-1}$, for the partial removal of the second material $k_i'=|(I_F-I_G)/(I_F-I_E)|$ with $I_E$=apse, $I_F$=terminal value in the interval $t_i-t_{i-1}$, and $I_G$=terminal value in the current stage.

4. A method according to claim 1, wherein the point in time $t_i$ is chosen so that the thickness of the layer i results between 0.1 nm and 50 nm.

5. A method according to claim 1, wherein the wavelength of the beam for the reflectivity measurement is chosen between 2 nm and 200 nm.

6. A method according to claim 1, wherein the number of layers N is chosen between 2 and 1000.

7. A method according to claim 1, wherein the layer i is applied by electron beam evaporation, laser evaporation or sputtering.

8. A method according to claim 1, the points in time $T_1$, $t_i$ and $t_i'$ are determined by fitting the measured reflectivity dependent on time.

9. A method according to claim 1, wherein the layer i is removed by means of an ion beam during the time interval between $t_i$ and $t_i'$.

10. A method according to claim 1, wherein a layer made from a material with high refractivity or high absorbency and a layer made from a material with low refractivity or low absorbency are applied alternately.

11. A method according to claim 10, wherein molybdenum, molybdenum carbide, molybdenum silicide, rhenium-tungsten, tungsten, tungsten carbide, tungsten silicide, nickel silicide are chosen as highly refractive or highly absorbent material.

12. A method according to claim 10, wherein silicon, carbon, beryllium or boron are chosen as less refractive or less absorbent materials.

13. A method according to claim 10, wherein the ratio of the layer thickness of the highly refractive material to the total of the layer thickness of the less refractive material and layer thickness of the highly refractive material is chosen between 0.2 and 0.8.

14. A method according to claim 10, wherein after each deposition of a pair of layers of less refractive and highly refractive or strongly absorbent and less absorbent material the topmost layer is partially removed with an ion beam.

15. A method according to claim 10, wherein after deposition of every layer, part of the layer is removed with an ion beam.

* * * * *